United States Patent
Chen et al.

(10) Patent No.: US 8,294,173 B2
(45) Date of Patent: Oct. 23, 2012

(54) LIGHT EMITTING ELEMENT

(75) Inventors: Wei-An Chen, Hsin-Chu Hsein (TW); Chu-Ping Fan, Hsin-Chu Hsein (TW)

(73) Assignee: Lextar Electronics Corp., Hsinchu (TW)

( * ) Notice: Subject to any disclaimer, the term of this patent is extended or adjusted under 35 U.S.C. 154(b) by 0 days.

(21) Appl. No.: 12/068,854

(22) Filed: Feb. 12, 2008

(65) Prior Publication Data

US 2010/0301357 A1    Dec. 2, 2010

(30) Foreign Application Priority Data

Jan. 4, 2008  (TW) ............................ 97100284 A

(51) Int. Cl.
 *H01L 33/00*   (2010.01)
(52) U.S. Cl. ............................ 257/99; 257/98; 257/100
(58) Field of Classification Search ............. 257/98–100
 See application file for complete search history.

(56) References Cited

U.S. PATENT DOCUMENTS

| 6,791,116 B2 * | 9/2004 | Takahashi et al. | 257/79 |
| 7,479,662 B2 * | 1/2009 | Soules et al. | 257/98 |
| 2005/0224829 A1 * | 10/2005 | Negley et al. | 257/99 |

FOREIGN PATENT DOCUMENTS

WO    WO2007080803    * 7/2007

* cited by examiner

*Primary Examiner* — Samuel Gebremariam
(74) *Attorney, Agent, or Firm* — Liu & Liu

(57) ABSTRACT

The present invention discloses a light emitting element including a carrier, at least one light emitting chip, an adhesive and a first encapsulated layer. The light emitting chip is fixed onto the carrier by the adhesive, and most of the carrier and adhesive are made of a light absorbing material, so that the external luminescence quantum efficiency of the light emitting element is poor. The invention adopts a first encapsulated layer disposed on the carrier to cover the light absorbing material including the adhesive or carrier, so as to reduce the light absorption and improve the external luminescence quantum efficiency of the light emitting element.

32 Claims, 7 Drawing Sheets

LIGHT EMITTING ELEMENT

BACKGROUND OF THE INVENTION (a) Field of the Invention

The present invention relates to a light emitting element, and more particularly to a light emitting element having a light absorbing material covered in the light emitting element to reduce the light from being absorbed, so as to improve the luminescence quantum efficiency of the exterior of the light emitting element.

(b) Description of the Prior Art

Since light emitting elements have the features of small size, low power consumption, low heat generation and long life, therefore they are used extensively in products like Christmas decorations, flashlights, automobile signal lights, and traffic signals, etc and the light emitting elements replace traditional tungsten light bulbs having similar functions. Further, the basic structure of a general light emitting element includes conducting terminals of different polarities and a carrying portion installed in a transparent package, a chip fixed at the carrying portion, and electrode layers of a chip constituting gold wires and connected to the conducting terminals. Each conducting terminal is extended out from the transparent package to form a power supply contact point.

With the electric conduction of the conducting terminals, a light source produced by the chip gives a light emitting effect. Of course, a luminescent material can be placed at the periphery of the chip, such that when the light source produced by the chip passes through the luminescent material, the light source is combined with the activated wavelength of the luminescent material to produce an expected color light. Compared with the traditional fixed specification of a light source, the related manufacturing process and technology of the light emitting elements are improved, so that the design and preparation of the luminescent material can produce a highly custom-made light emitting element, and expand the market of light emitting element rapidly.

Referring to FIG. 1 for a schematic view of the structure of a general prior art light emitting element, the light emitting element 1 comprises: a carrier 11, fixed onto a light emitting chip 13 by a silver adhesive 12, and having a circuit electrically coupled to the light emitting chip 13; a luminescent material 14 and a package body 15, installed at the periphery of the light emitting chip 13, such that when a light source produced by the light emitting chip 13 is passed through the luminescent material 14, the light source is combined with the wavelength of the activated luminescent material 14 to produce an expected color light.

The carrier 11 is generally made of a Group III, IV or V semiconductor, such as silicon, arsenic or gallium material, and such semiconductor material is a material capable of absorbing a light source, and the silver adhesive 12 is also a material capable of absorbing a light source. When the light emitting chip 13 emits lights, a portion of the light source is incident towards the carrier 11 or the silver adhesive 12, such that the light source is absorbed by the carrier 11 or the silver adhesive 12, and cannot be refracted or reflected. As a result, the overall external luminescence quantum efficiency of the light emitting element is poor, and the overall brightness of the light emitting element drops.

SUMMARY OF THE INVENTION

Therefore, it is a primary objective of the present invention to overcome the foregoing shortcomings of the prior art by providing an improved structure of a light emitting element, wherein a light absorbing material in the light emitting element is covered to reduce light absorption and enhance the external luminescence quantum efficiency of the light emitting element.

To achieve the foregoing objective, the invention provides a light emitting element comprising: a carrier, at least one light emitting chip, an adhesive and a first encapsulated layer. The light emitting chip is fixed onto the carrier by the adhesive, and the first encapsulated layer is disposed on the carrier for covering the light absorbing material including the adhesive or carrier to reduce light absorption.

DETAILED DESCRIPTION OF THE PREFERRED EMBODIMENTS

The objective, technical measures and performance of the present invention will become apparent in the detailed description of the preferred embodiments with reference to the accompanying drawings as follows:

In the present invention, a light emitting chip of a light emitting element is installed on a carrier, and a first encapsulated layer is disposed next to the light emitting chip and provided for covering a light absorbing material or any material that absorbs light, and exposing a light emitting activation layer of the light emitting chip, such that the light produced by the light emitting chip will not be incident to the light absorbing material or absorbed by the light absorbing material, so as to enhance the external luminescence quantum efficiency of the light emitting element.

Figure 2:
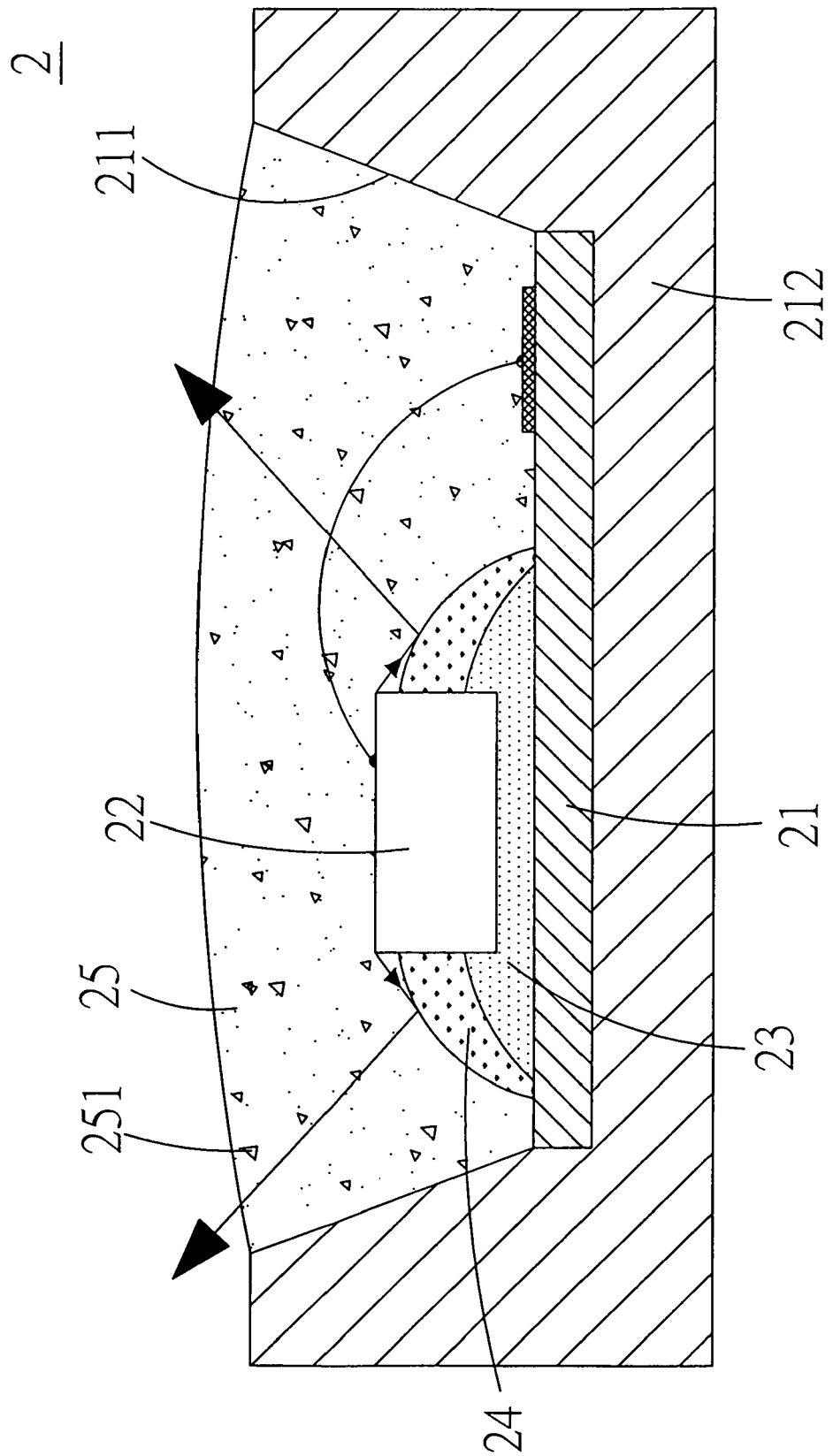
FIG. 2 is a schematic view of the structure of a light emitting element of the invention.

The light emitting element 2 as shown in FIG. 2 comprises:

a carrier 21, being a Group III, IV or V semiconductor such as silicon, arsenic or gallium material, and the carrier 21 being contained in a containing portion 211 of a housing 212;

at least one light emitting chip 22, installed on the containing portion 211 of carrier 21, and electrically coupled with a circuit of the carrier 21;

an adhesive 23, disposed between the light emitting chip 22 and the carrier 21, such that the light emitting chip 22 can be fixed onto the carrier 21, wherein the adhesive 23 can be a silver adhesive;

a first encapsulated layer 24, disposed on the carrier 21, for covering the adhesive 23, wherein the first encapsulated layer 24 has a height less than the light emitting activation layer of the light emitting chip 22 to expose a light emitting layer of the light emitting chip 22 and prevent blocking the light produced by the light emitting activation layer; and a second encapsulated layer 25, disposed on top of the first encapsulated layer 24, and having a plurality of luminescent particles 251.

Figure 3:
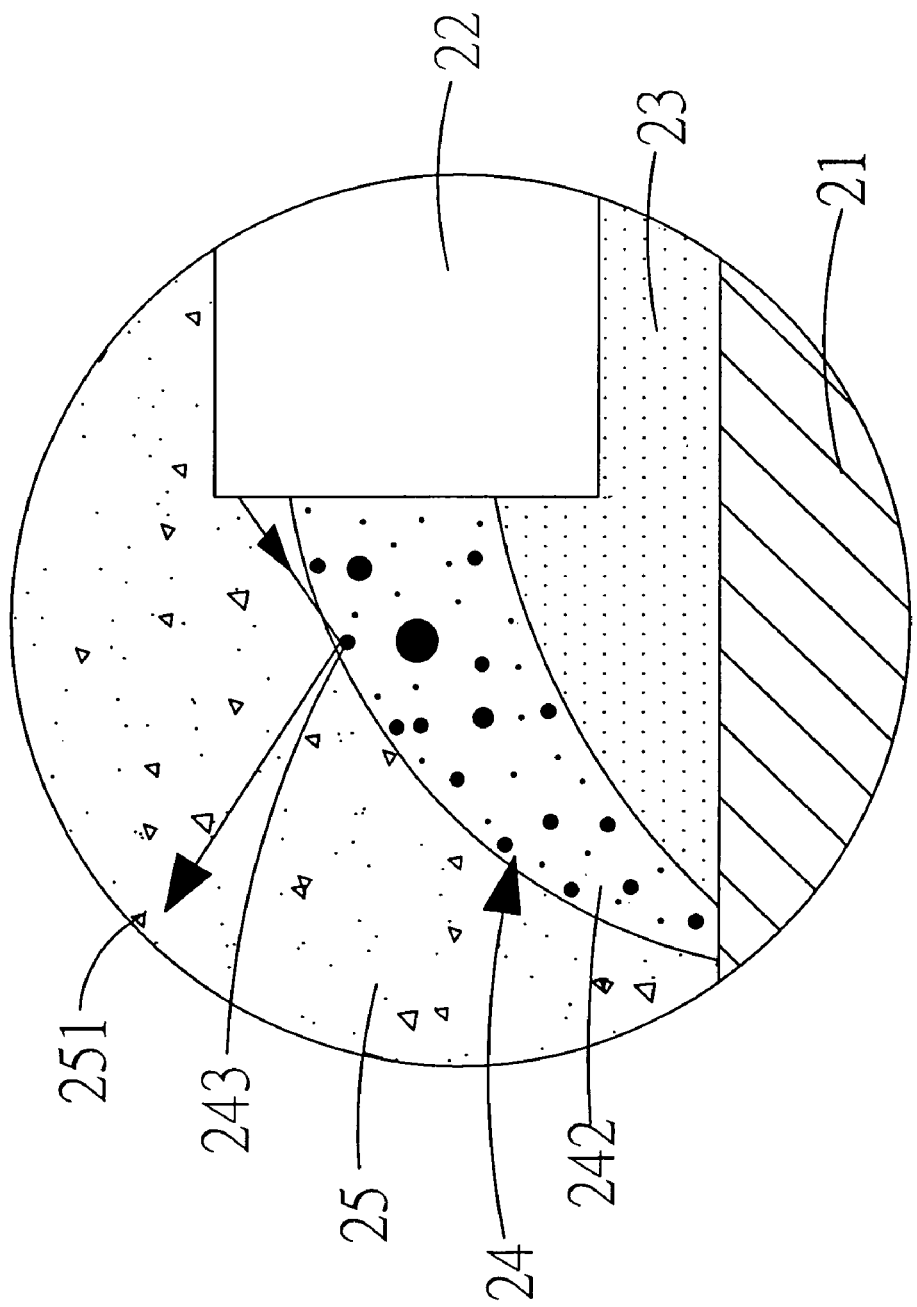
FIG. 3 is an enlarged view of a portion of the structure of a light emitting element of the invention.

If a portion of the light source produced by the light emitting chip 22 after being electrically conducted is incident towards the adhesive 23, the light is incident to the first encapsulated layer 24 only, since the adhesive 23 is covered by the first encapsulated layer 24. The first encapsulated layer 24 of this embodiment includes a package material 242 and a medium 243 as shown in FIG. 3, and the package material 242 can be a transparent or opaque material, and the medium 243 can be a reflective particle such as titanium dioxide ($TiO_2$), zinc oxide (ZnO), aluminum nitride (AlN), aluminum oxide ($Al_2O_3$) or barium carbonate ($BaCO_3$), so that lights can pass through each medium 243 and be reflected, and the light is incident upward and towards the second encapsulated layer 25. Finally, an expected color light can be emitted by the light mixing function of the luminescent particles 251.

Figure 4:
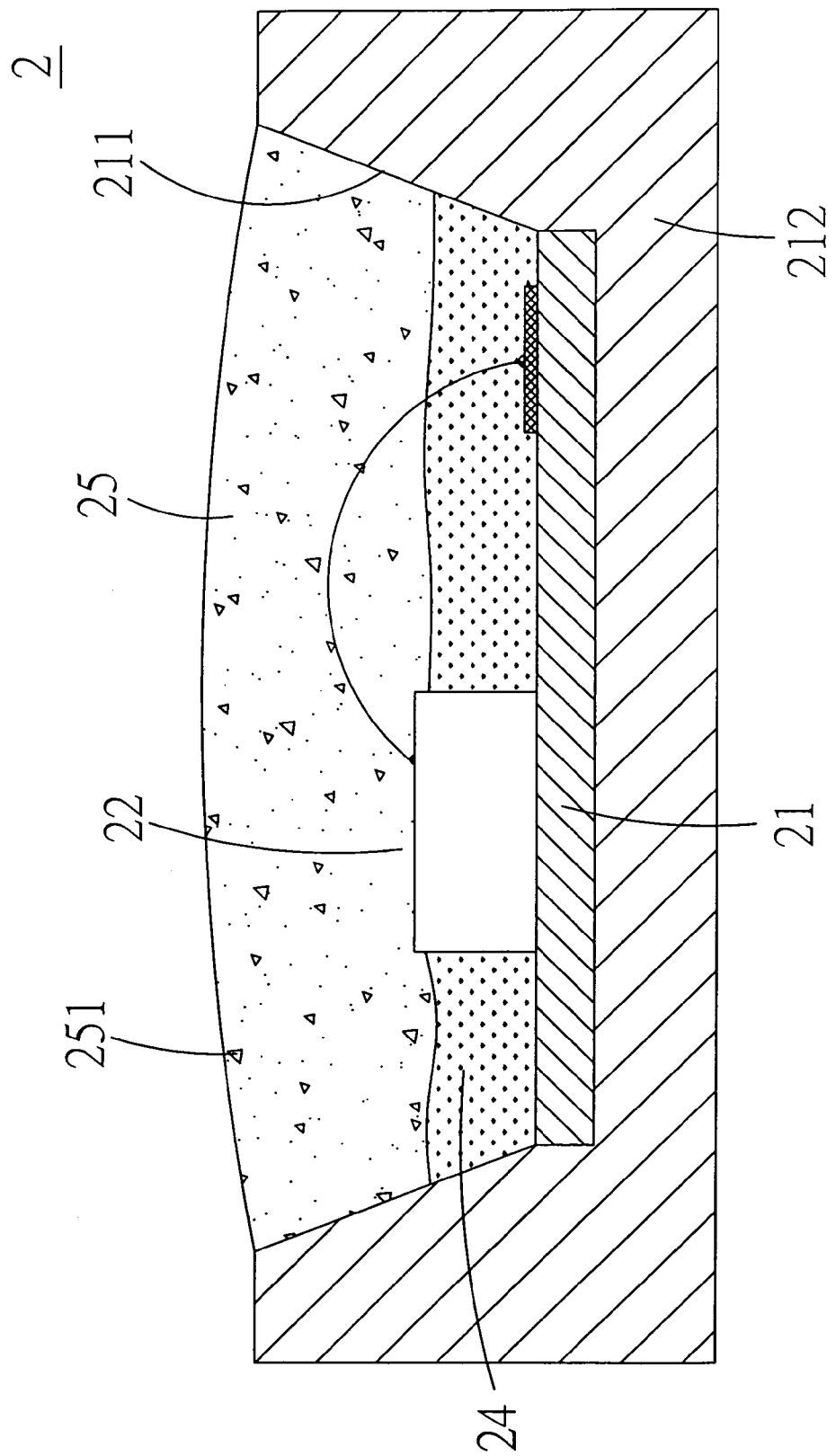
FIG. 4 is a schematic view of another structure of a light emitting element of the invention.
Figure 5:
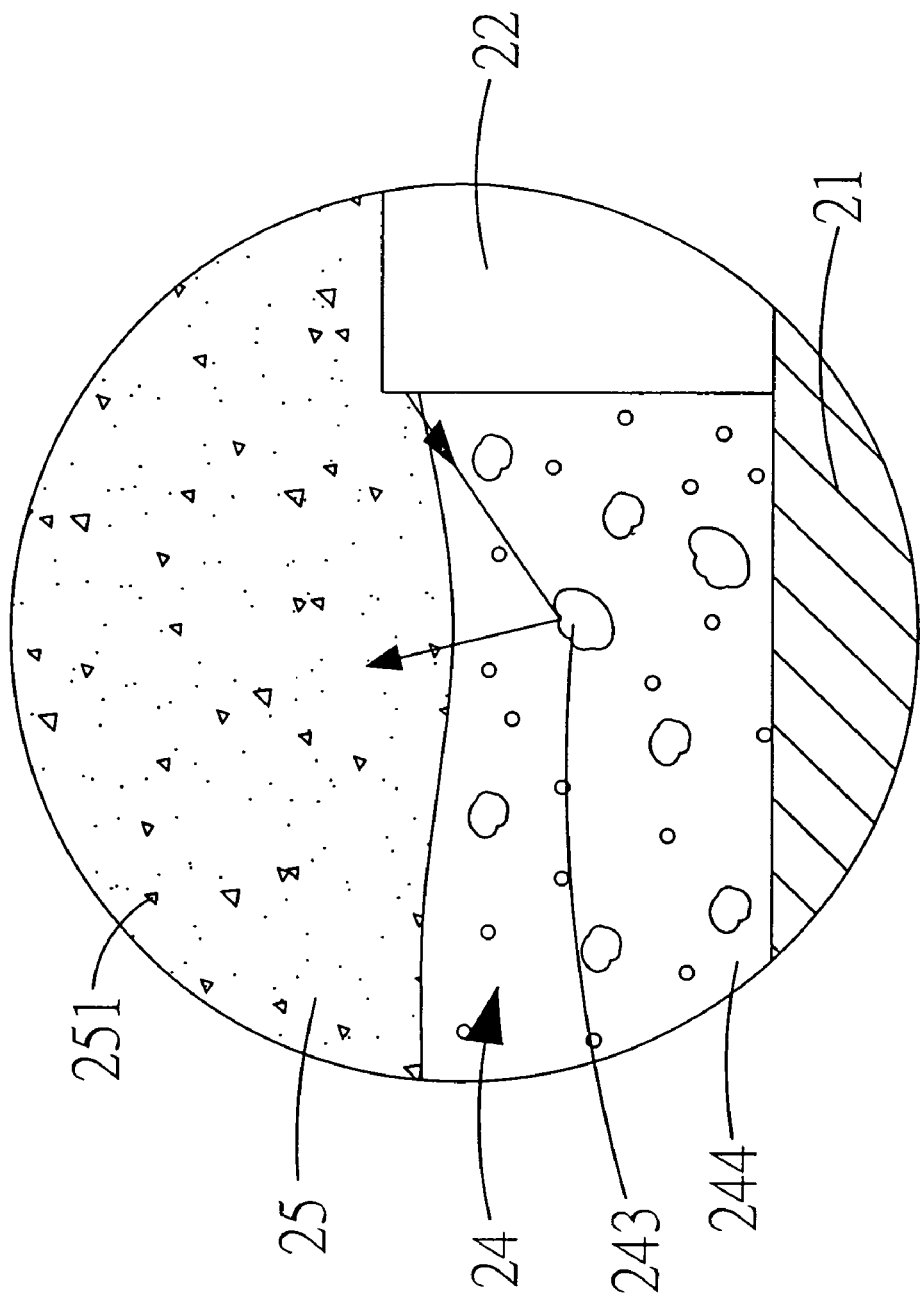
FIG. 5 is an enlarged view of a portion of the structure of a light emitting element of the invention.
Figure 6:
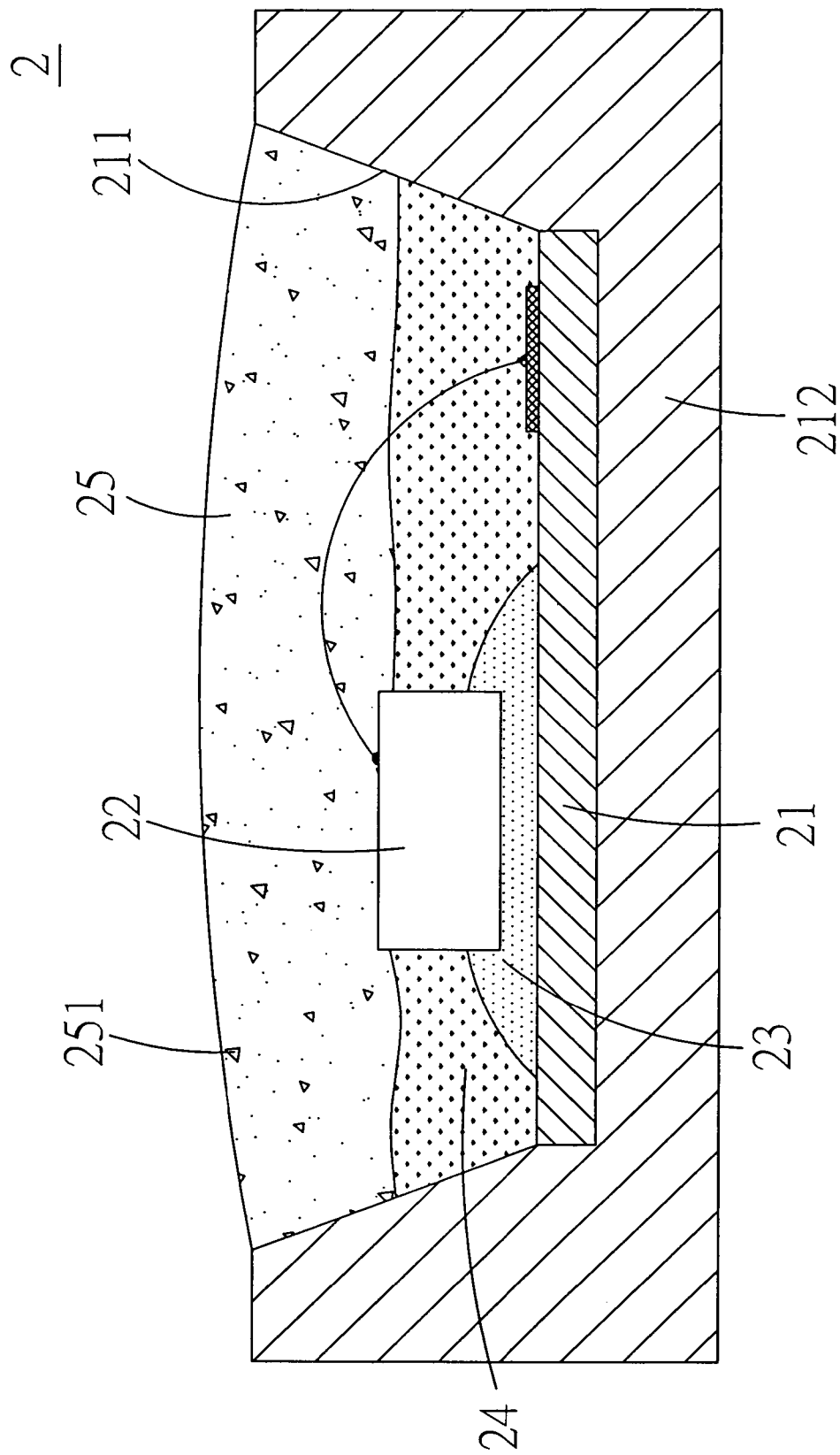
FIG. 6 is a schematic view of a further structure of a light emitting element of the invention.

In another embodiment as shown in FIG. 4, the light emitting element 2 comprises: a carrier 21, at least one light emitting chip 22 and a first encapsulated layer 24, wherein the housing 212 has a containing portion 211 for accommodating the light emitting chip 22 and electrically connecting a circuit of the carrier 21, and the first encapsulated layer 24 covers the carrier 21, and the first encapsulated layer 24 includes a package material 244 and a medium 243 as shown in FIG. 5, and the package material 242 can be a transparent or opaque material, and the medium 243 can be made of refractive particles, bubbles or refractive particles with a refractive index of 1.5~5.0, and the medium has a particle diameter of 20 nm~5 μm, such that the light produced by the light emitting chip 22 will not be incident to the light absorbing material of the carrier 21, and the light is incident toward an expected direction by the reflection from each medium in the first encapsulated layer 24. An expected color light is produced by the light mixing function of the luminescent particles 251. If it is necessary to fix the light emitting chip 22 to the carrier 21 by the adhesive 23 as shown in FIG. 6, the first encapsulated layer 24 will cover the light absorbing materials of both carrier 21 and adhesive 23.

It is noteworthy to point out that the present invention has the following advantages over the prior art:

1. The invention uses the first encapsulated layer to cover a portion of light absorbing material in the light emitting element to reduce the light absorption of the light absorbing material, so as to improve the external luminescence quantum efficiency of the light emitting element.

2. The first encapsulated layer includes refractive or reflective medium, such that the light can be emitted in an expected direction, so as to enhance the overall brightness of the light emitting element.

The light emitting element in accordance with the present invention (Embodiment 1) and a prior art light emitting element structure (Comparison Example 1) are compared, and their light intensity (Iv) and light flux(Flux) are compared.

Figure 1:
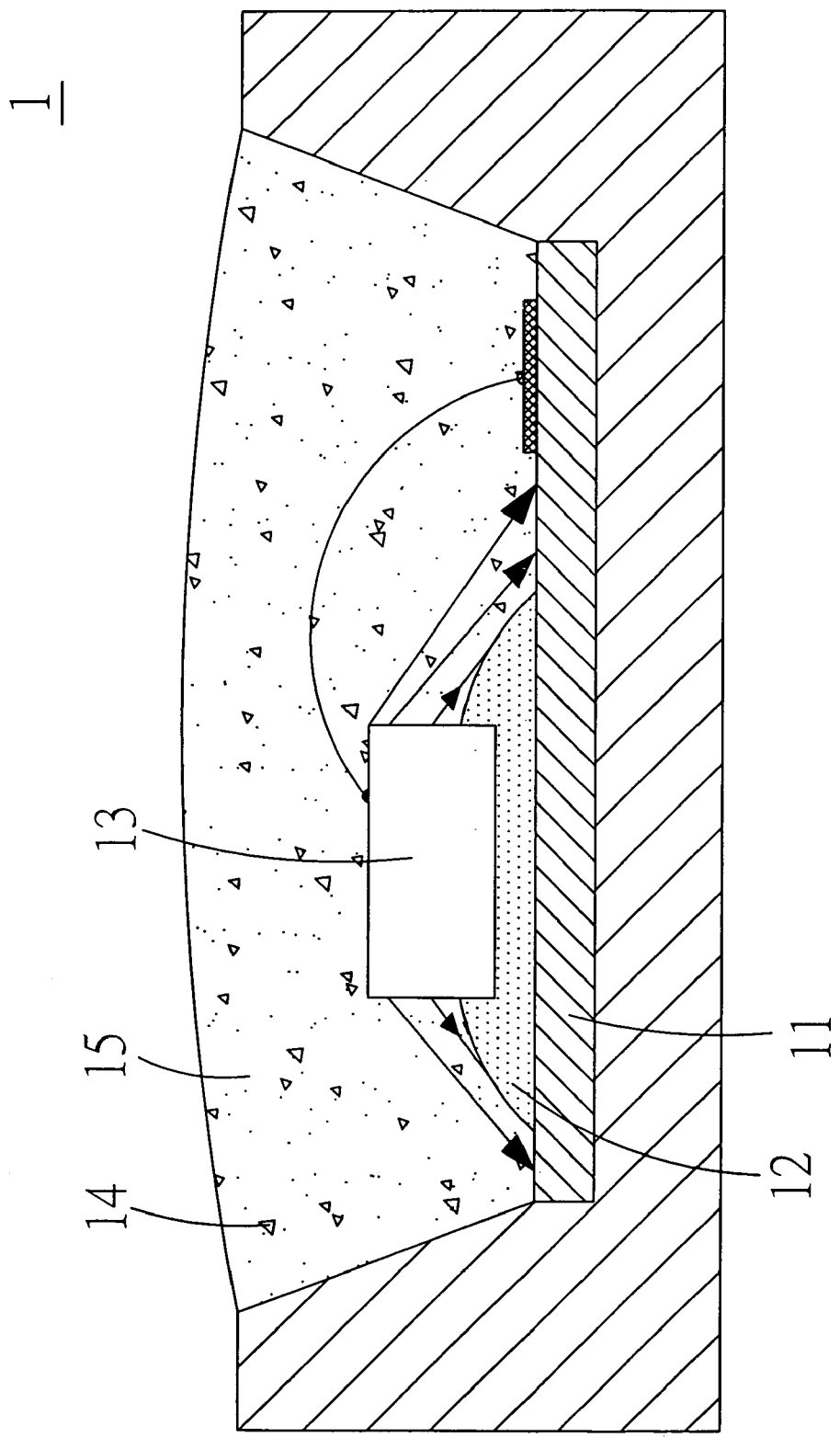
FIG. 1 is a schematic view of the structure of a prior art light emitting element.

The structure of a light emitting element in accordance with the Embodiment 1 is shown in FIG. 6, and the structure a light emitting element in accordance with the Comparison Example is shown in FIG. 1.

TABLE 1

| Results | Average light intensity Iv (cd) | Average light flux (lm) | Average light intensity Increase (%) | Average light flux Increase (%) |
|---|---|---|---|---|
| Comparison Example 1 | 1.431 | 3.883 | — | — |
| Embodiment 1 | 1.642 | 4.398 | +14.72 | +13.27 |

Figure 7:
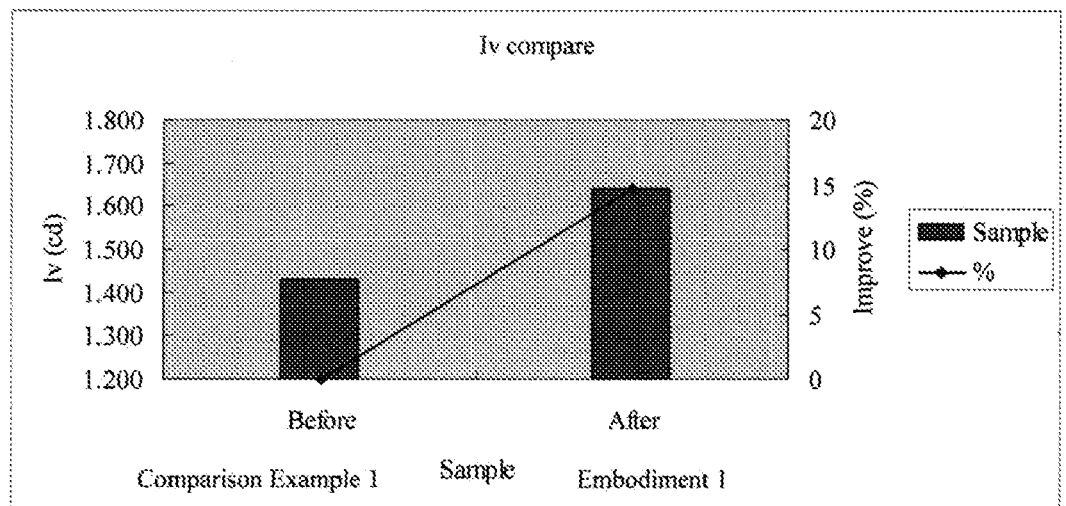
FIG. 7 is a bar chart of the light intensity of Comparison Example 1 versus Embodiment 1.
Figure 8:
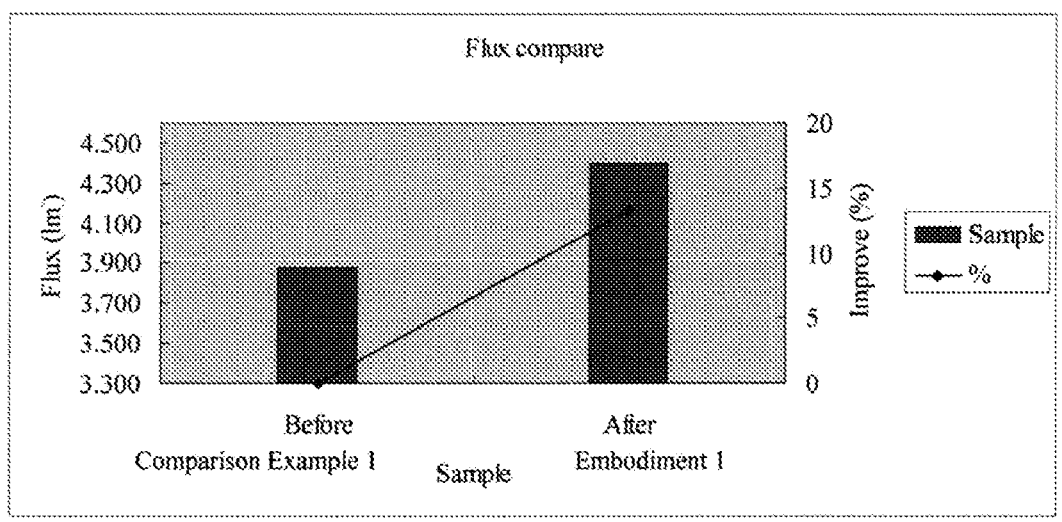
FIG. 8 shows a bar chart of the light flux of Comparison Example 1 versus Embodiment 1.

FIG. 7 shows a bar chart of the light intensity of Comparison Example 1 and Embodiment 1 after the power is on, and FIG. 8 shows a bar chart of the light flux, and Table 1 shows the average light intensity, the light flux and the increase percentage. The experiment data listed above show that the present invention adopting a first encapsulated layer to cover the light absorbing material in light emitting element can increase the ratio of the light intensity and the light flux and also improve the overall brightness by approximately 5~20%.

In summation of the description above, the invention provides an improved structure of a light emitting element and complies with the requirements of patent application, and thus is duly filed for patent application.

While the invention has been described by means of specific embodiments, numerous modifications and variations could be made by those skilled in the art without departing from the scope and spirit of the invention set forth in the claims.

We claim:

1. A light emitting element, comprising:
a housing having upwardly extending containing portions;
a separate carrier disposed between the upwardly extending containing portions, wherein the carrier has a top surface defined between the upwardly extending containing portions, wherein the top surface of the carrier comprises a first region, a second region and a third region;
at least one light emitting chip having a light emitting surface, wherein the light emitting chip is installed on the first region of the top surface of the carrier;
an adhesive disposed between the first region of the top surface of the carrier and the light emitting chip; and
a first encapsulating layer disposed on the second region of the top surface of the carrier, without covering the light emitting surface, wherein the third region of the top surface of the carrier is neither covered by the light emitting chip, the adhesive nor the first encapsulating layer.

2. The light emitting element of claim 1, wherein the second encapsulating layer further covers the third region of the top surface of the carrier which is neither covered by the light emitting chip, the adhesive or the first encapsulating layer.

3. The light emitting element of claim 1, wherein the first encapsulating layer does not extend to contact any part of the upwardly extending containing portions.

4. The light emitting element of claim 1, wherein a portion of the adhesive extends beyond the first region into the second region, wherein said portion of the adhesive is not covered by the light emitting chip, and wherein the first encapsulating layer covers the portion of the adhesive not covered by the light emitting chip.

5. The light emitting element of claim 4, wherein the adhesive is a silver adhesive.

6. The light emitting element of claim 1, wherein the first encapsulating layer has a top surface lower than the light emitting surface.

7. The light emitting element of claim 6, further comprising a second encapsulating layer disposed over the first encapsulating layer and the light emitting chip.

8. The light emitting element of claim 1, wherein the first encapsulating layer includes a package material and a medium.

9. The light emitting element of claim 8, wherein the medium is composed of refractive particles, bubbles or reflective particle.

10. The light emitting element of claim 9, wherein the refractive particle has a refractive index of 1.5 to 5.0.

11. The light emitting element of claim 8, wherein the medium has a particle diameter of 20 nm to 5 μm.

12. The light emitting element of claim 8, wherein the medium is made of a material selected from the collection of titanium dioxide ($TiO_2$), zinc oxide (ZnO), aluminum nitride (AlN), aluminum oxide ($Al_2O_3$) and barium carbonate ($BaCO_3$).

13. A light emitting element, comprising:
a housing having upwardly extending containing portions;
a separate carrier disposed between the upwardly extending containing portions, wherein the carrier has a top surface defined between the upwardly extending containing portions, wherein the top surface of the carrier comprises a first region, a second region and a third region;
at least one light emitting chip, installed on the first region of the top surface of the carrier;
an adhesive disposed between the first region of the top surface of the carrier and the light emitting chip; and
a first encapsulating layer disposed on the second region of the top surface of the carrier adjacent to the light emitting chip, without covering above the light emitting chip, wherein the third region of the top surface of the carrier is neither covered by the light emitting chip, the adhesive nor the first encapsulating layer.

14. The light emitting element of claim 13, wherein the medium has a particle diameter of 20 nm to 5 μm.

15. The light emitting element of claim 13, wherein the medium is made of a material selected from the collection of titanium dioxide ($TiO_2$), zinc oxide (ZnO), aluminium nitride (AlN), aluminum oxide ($Al_2O_3$) and barium carbonate ($BaCO_3$).

16. The light emitting element of claim 13, wherein the first encapsulating layer does not extend to contact any part of the upwardly extending containing portions.

17. The light emitting element of claim 13, wherein a portion of the adhesive extends beyond the first region into the second region, and wherein said portion of the adhesive is not covered by the light emitting chip.

18. The light emitting element of claim 17, wherein the adhesive is made of a light absorbing material, and the first encapsulating layer covers the portion of the adhesive not covered by the light emitting chip.

19. The light emitting element of claim 13, wherein the first encapsulating layer has a top surface lower than the light emitting chip.

20. The light emitting element of claim 19, further comprising a second encapsulating layer disposed over the first encapsulating layer and the light emitting chip.

21. The light emitting element of claim 13, wherein the first encapsulating layer includes a package material and a medium.

22. The light emitting element of claim 21, wherein the medium is composed of refractive particles, bubbles or reflective particle.

23. The light emitting element of claim 22, wherein the refractive particle has a refractive index of 1.5 to 5.0.

24. A light emitting element, comprising:
a housing having upwardly extending containing portions;
a separate carrier disposed between the upwardly extending containing portions, wherein the carrier extends to contact the upwardly extending containing portions and wherein the carrier has a top surface comprising a first region, a second region and a third region;
a light emitting chip supported by the first region of the top surface of the carrier, wherein the light emitting chip has a light emitting surface; and
a first encapsulating layer disposed above the second region of the top surface of the carrier, extending to contact sides of the light emitting chip without covering the light emitting surface.

25. The light emitting element as in claim 24, further comprising an adhesive disposed between the first region of the top surface the carrier and the light emitting chip, wherein a portion of the adhesive extends beyond the first region to the second region, wherein said portion of the adhesive is not covered by the light emitting chip, and wherein the first encapsulating layer covers the portion of the adhesive not covered by the light emitting chip and the first encapsulating layer directs light emitted from the light emitting chip in a direction away from the adhesive.

26. The light emitting element of claim 24, further comprising:
a second encapsulating layer disposed above the first encapsulating layer and the light emitting surface.

27. The light emitting element as in claim 26, wherein the light emitting surface is exposed directly to the second encapsulating layer.

28. The light emitting element as in claim 27, wherein the light emitting surface faces away from the carrier, and the first encapsulating layer has a top surface facing away from the carrier and which is below the light emitting surface, such that the light emitting surface is exposed directly to the second encapsulating layer.

29. The light emitting element as in claim 28, wherein the first encapsulating layer comprises a material that directs light emitted from the light emitting chip in a direction away from the carrier.

30. The light emitting element as in claim 29, further comprising an adhesive disposed between the first region of the top surface the carrier and the light emitting chip, wherein a portion of the adhesive extends beyond the first region to the second region, wherein said portion of the adhesive is not covered by the light emitting chip, and wherein the first encapsulating layer covers the portion of the adhesive not covered by the light emitting chip and the first encapsulating layer directs light emitted from the light emitting chip in a direction away from the adhesive.

31. The light emitting element as in claim 29, wherein the first encapsulating layer directs light emitted from the light emitting chip towards the second encapsulating layer.

32. The light emitting element as in claim 29, wherein the material comprises a light reflecting material.

* * * * *